United States Patent [19]

Kaufman

[11] 4,001,702
[45] Jan. 4, 1977

[54] HIGH SPEED FM AND AM DEMODULATOR
[75] Inventor: Barry M. Kaufman, Pine Brook, N.J.
[73] Assignee: R F L Industries, Inc., Boonton, N.J.
[22] Filed: Nov. 3, 1975
[21] Appl. No.: 628,569
[52] U.S. Cl. .......................... 329/135; 325/317; 325/349; 329/137; 329/140; 329/145; 329/205 R
[51] Int. Cl.² .................... H03D 3/00; H03D 5/00
[58] Field of Search .......... 329/135, 110, 137, 140, 329/145, 204, 205 R; 325/315–317, 349

[56] References Cited
UNITED STATES PATENTS 3,614,640 10/1971 Wolf .............................. 329/140 X
3,764,927 10/1973 Allinger et al. ................ 329/137 X Primary Examiner—Siegfried H. Grimm
Attorney, Agent, or Firm—Rudolph J. Jurick

[57] ABSTRACT

A high speed arrangement for simultaneously demodulating the AM and FM information coming in on a tone frequency carrier. In the case of the incoming tone signal being only FM modulated, the FM demodulator extracts the data whereas the AM demodulator provides an output which can be used to squelch the FM demodulated data channel when noise or interference reaches a predetermined level.

8 Claims, 3 Drawing Figures

HIGH SPEED FM AND AM DEMODULATOR

BACKGROUND OF THE INVENTION

An AM demodulator made in accordance with this invention is extremely fast in operation. This is accomplished by splitting the incoming signal into two quadrature components, each then being separately full wave rectified and the outputs of the rectifiers are summed and then subsequently filtered. The output of one full wave rectifier is at double the frequency of the incoming signal and the instantaneous output voltage periodically varies between 0 and 1.41 times the incoming sinewave RMS voltage. The outputs of the two rectifiers are interlaced and their sum is at four times the frequency of the incoming signal with instantaneous voltage periodically varying between 1.41 and 2 times the RMS voltage of the sinewave input signal. The carrier feedthrough ripple is, therefore, much easier to filter being twice the frequency and 42% of the amplitude that would occur with a single full wave rectifier. This means that a low pass filter with less sections and/or higher cutoff frequency can be used for a given amount of carrier feedthrough. It is a well known property of filters that time delay is decreased by reducing the complexity of the filter or by increasing its bandwidth.

There are many types of FM demodulators. One broad category covers all of those that employ amplitude limiting followed by some form of frequency discriminator. The discriminator may be a ratio detector, a phase locked loop, a pulse counting detector, a Foster Sealy discriminator, etc. Amplitude limiting prior to frequency discrimination removes any continuous phase information that might have been available from the incoming tone carrier and all that is left out of the infinitely clipped signal are the positions of the zero crossings. If the FM data modulation is asynchronous, then a limiter/discriminator FM demodulator will cause significant timing error if modulation frequency approaches tone carrier frequency. This is because the frequency of the tone carrier may change in between zero crossings but the FM discriminator will not see this until the next zero crossing. Also, the limiter/discriminator FM demodulator can create an error output due to spiking. The spiking is caused when the signal to noise or the signal to interference ratio becomes low. Under these conditions, there is a very rapid rate of change of phase at the time that the signal and the interference are at phase opposition. The combined amplitude of the two are however low at that instant, at the input of the limiter. If it were not for limiting, the rapid rate of change of phase which creates a high output from the discriminator would be offset by the low amplitude which reduces the output of the discriminator. Hard limiting will however maintain amplitude and therefore very high level spikes will appear at the output of the discriminator. These spikes may create an error in the received data signal.

Another classification of FM demodulators are the linear, continuous phase types. These devices are not preceded by an amplitude limiter (hard clipper). They may be preceded by an amplifier with slow automatic gain control as long as the amplifier passes the input signal waveform without adding non-linear distortion. Various detection means of this type are available, some being phase locked loops, slope detectors, tuned ratio detectors, etc.. The FM demodulator made in accordance with this invention falls into the classification of a linear, continuous phase, ratio detector. However, this discriminator has the advantage that when the incoming signal is at center frequency, no carrier feedthrough ripple appears at the output or even prior to the post detection low pass filter. Most FM demodulators have a high carrier output ripple regardless of the frequency of the carrier within its band of operation. The demodulated signal in fact, may be much lower in amplitude than the carrier ripple, requiring an extensive amount of post detection low pass filtering. Not only does this demodulator have no ripple at center frequency but the ripple increases as frequency is moved away from center, proportionately to the demodulated output voltage. This produces essentially a constant ratio of output voltage to ripple with the ripple being much less than with conventional discriminators. Therefore, the post discriminator low pass filter can have either less sections or a higher cut-off frequency resulting in faster response time.

Since this FM demodulator does not use amplitude limiting and is continuously sensitive to the rate of change of phase of the incoming signal, the output of the demodulator will change simultaneous with a change in the rate of change of phase (frequency) of the incoming signal. The circuit doesn't have to wait for a zero crossing to know what the incoming frequency is. Also, since there is no pre-discriminator limiting, if interference is in the channel and the level of this interference approaches the level of the legitimate signal, then the spiking mentioned above will not occur. The reason for this is that at the point where the signal and interference are at phase opposition and phase is changing most rapidly, the amplitude will also be at minimum. Therefore the output of the discriminator will be attenuated at the point of maximum sensitivity to the interference.

SUMMARY OF THE INVENTION

Circuitry for simultaneous demodulation of an FM component and an AM component, both modulated on an incoming carrier. The input carrier signal drives both a quadrature all-pass network and a notch filter. The outputs of the quadrature all-pass network and the notch filter each drive summing and difference amplifiers with each amplifier driving an active full wave rectifier. One rectifier output is a positive voltage and the other a negative voltage and these outputs are summed and low pass filtered to produce an output voltage which is a function of input signal frequency. The input signal and the output of the quadrature network are applied to individual active full wave rectifiers. The rectifier outputs are summed and low pass filtered to produce an output DC voltage proportional to the amplitude of the input signal.

An object of this invention is the provision of an arrangement for simultaneously demodulating the AM and FM information coming in on a tone frequency carrier that has been quadrature modulated by data signals or by data and a clock.

An object of this invention is the provision of an AM demodulator having high linearity, fast response time and low carrier feedthrough ripple.

An object of this invention is the provision of an FM demodulator having a high linearity of output voltage versus input frequency, a low noise interference threshold, continuous phase operation with resultant fast response time, no high level output spikes and low carrier feed through ripple.

An object of this invention is the provision of an FM demodulator for extracting data coming in on a tone frequency carrier, and an AM demodulator for squelching the FM demodulated data channel when noise or interfering signals reach a level which would cause excessive errors in the received signal.

The above-stated and other objects and advantages of the invention will become apparent from the following description when taken with the drawings. It will be understood, however, that the drawings are for purposes of illustration and are not to be construed as defining the scope or limits of the invention, reference being had for the latter purpose to the claims appended hereto.

BRIEF DESCRIPTION OF THE DRAWINGS

In the drawings wherein like reference numerals denote like parts in the several views.

DESCRIPTION OF PREFERRED EMBODIMENT

Figure 1:
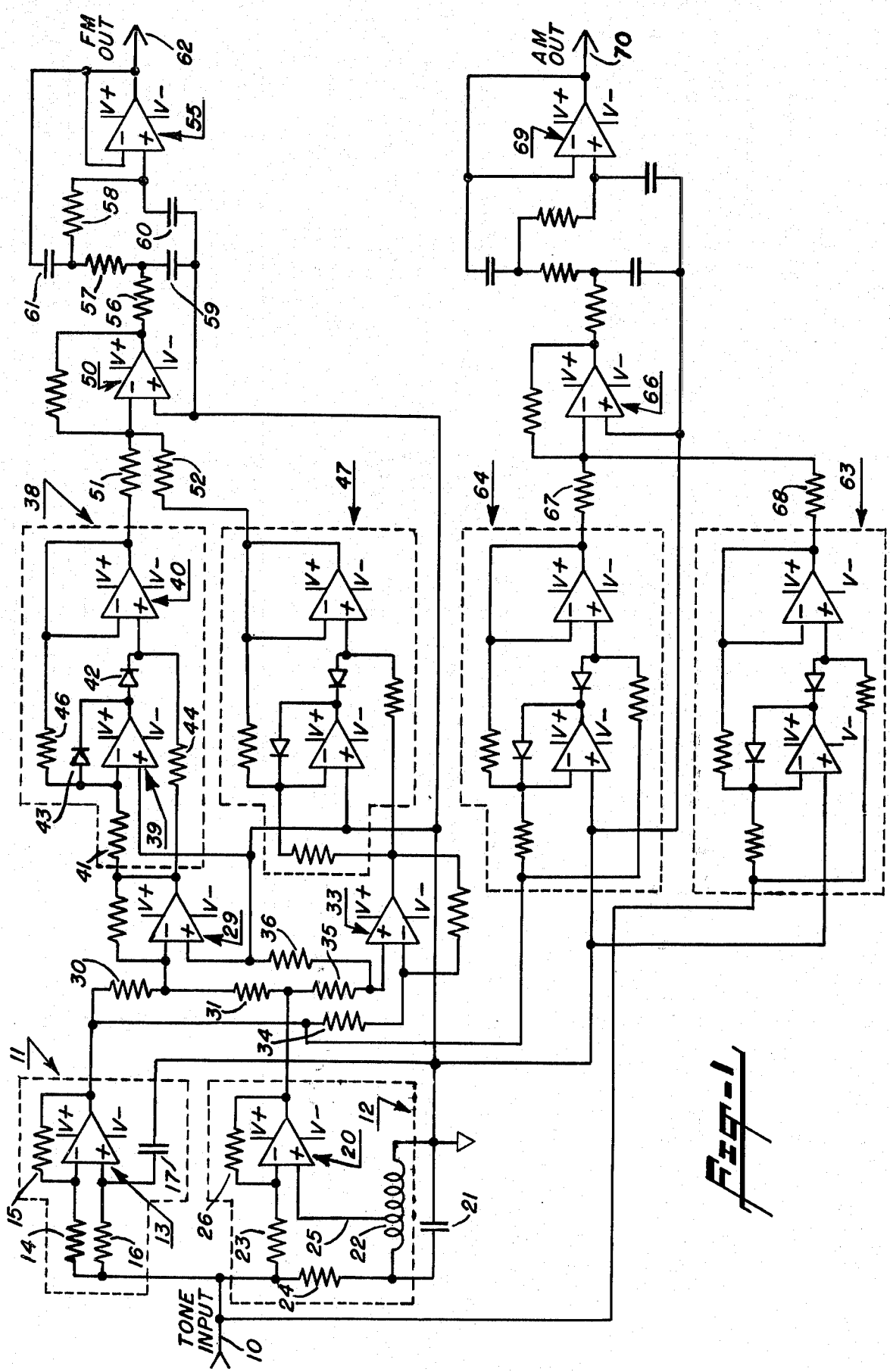
FIG. 1 is a circuit diagram of apparatus made in accordance with this invention.
Figure 2A:
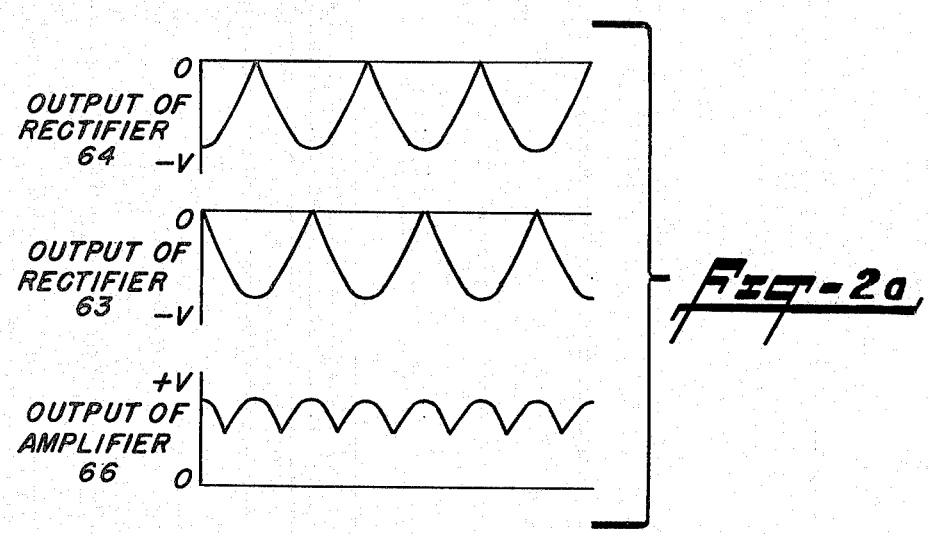
FIG. 2a shows the waveforms at key points in the AM detection circuit.
Figure 2B:
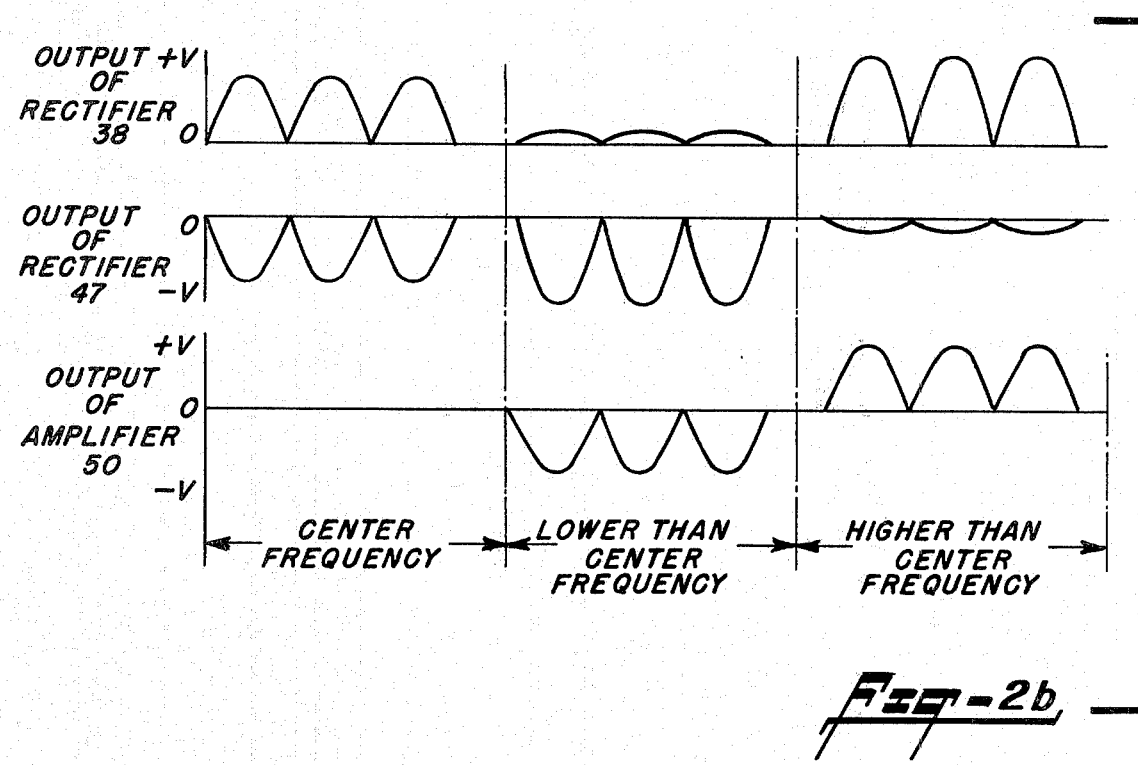
FIG. 2b shows the waveforms at key points in the FM detection circuit.

Referring to FIG. 1, the incoming signal appearing on the line 10 is applied to the input of a quadrature all-pass network 11 and a notch filter 12. The all-pass network comprises an operational amplifier 13 and associated components and the signal is fed simultaneously to the amplifier's inverting and non-inverting inputs. The inverting input is fed through the resistor 14 with a feedback resistor 15 controlling the gain. The network 11 has unity gain and constant amplitude across the pass band of interest and the output phase remains approximately in quadrature (90° lag) with the input phase. The phase shift is generated by the resistor 16 and capacitor 17, the voltage at the junction point of this resistor and capacitor driving the non-inverting input of the amplifier 13.

The notch filter 12 comprises an operational amplifier 20 and associated components. A capacitor 21 and inductor 22 form a parallel resonant circuit. The input signal is fed to the inverting input of the amplifier through the resistor 23 and to the non-inverting input, through the resistor 24, inductor 22 and inductor tap 25. Feedback resistor 26 controls the amplifier gain. The signal applied through resistor 23 to the inverting input is inverted and amplified and the signal applied to the non-inverting input through the resonator (capacitor 21 and coil 22) is amplified but not inverted. The circuit components are so chosen that at the center frequency of the channel, which is the frequency of the resonator, the signal at both the inverting and non-inverting inputs to the amplifier 20 are equal. Under this condition, cancellation takes place in the amplifier and there will be no output. As the signal frequency deviates from center frequency, the resonators impedance will drop and the level at the non-inverting input to the amplifier will drop correspondingly. Full cancellation no longer takes place and there will be an output from the amplifier. The notch filter output phase leads the input phase by 90° for frequencies slightly lower than the zero transmission center frequency and its output lags input by 90° for slightly higher frequencies. There is a rapid 180° phase shift when signal frequency transcends the notch frequency. As signal frequency extends further from the notch frequency, either higher or lower, the output of the notch filter increases in amplitude. If the bandwidth of the notch filter is considerably wider than the passband of interest, then the filter's output will remain approximately in quadrature with the input phase.

The output of the quadrature network 11 is coupled to the inverting input of a conventional operational summing amplifier 29 by the resistor 30, and the output of the notch filter 12 is coupled to the inverting input of this amplifier by the resistor 31. The output of the amplifier 29 will be the sum of the output of the quadrature network and the notch filter. The output of the quadrature network 11 is coupled to the inverting input of a conventional operational, differencing amplifier 33 by the resistor 34, and the output of the notch filter is coupled to the non-inverting input of this amplifier by resistor 35. Resistors 35 and 36 form a voltage divider. The outputs of the summing amplifier 29 and differencing amplifier 33 are equal at the center frequency when there is no output from the notch filter. When frequency shifts high, there is an output from the notch filter which is proportional to the frequency shift and the notch filter's output lags its input by approximately 90°. The outputs of the quadrature network and the notch filter add in the amplifier 29 thereby increasing the amplifier output. On the other hand, the outputs of the quadrature network and the notch filter subtract in the amplifier 33, thereby decreasing amplifier output. If signal frequency shifts low then there will be an output from the notch filter 12 proportional to the frequency shift and the output of this filter will lead its input by approximately 90°. Under this condition the output of the notch filter will be out-of-phase with the output of the quadrature network and the combination will cause the output of the summing amplifier 29 to decrease and the output of the differencing amplifier 33 to increase.

From the above it can be seen that when the incoming signal is at the demodulator's center frequency the outputs of the amplifiers 29 and 33 will be equal, whereas as the input frequency increases from center the output of amplifier 29 will tend to increase with a corresponding decrease in the output of amplifier 33. When signal frequency shifts low from center, the opposite will happen.

The output of the amplifiers 29 and 33 are each rectified by an active operational full wave rectifier. These rectifiers are identical except for output polarity which is controlled by the direction of the diodes, and, therefore, only one of such rectifier circuits will be described. The rectifier enclosed within the dotted line 38 comprises operational amplifiers 39 and 40. When the output from the summing amplifier 29 goes positive, then the inverting input of the amplifier 39 will be driven positive by the resistor 41 and the amplifier output will go negative which will reverse bias the diode 42. The diode 43 improves the response time of the amplifier 39 by preventing its output from swinging full negative into saturation. The negative output of amplifier 39 is fed through diode 43 back to the inverting amplifier input. The positive output voltage of the summing amplifier 29 is fed through resistor 44 to the non-inverting input of amplifier 40 which is connected as a source follower. Thus, the output of amplifier 40 will closely follow its input as diode 42 is reversed biased and will not load the circuit. When the output of the summing amplifier goes negative then the inverting input of amplifier 39 is driven negative through resistor 41, whereby the output of this amplifier will go positive causing diode 42 to conduct. The non-inverting input of amplifier 40 will be driven positive through the low impedance path established through diode 42. The negative voltage output of the amplifier 29 will attempt to drive the non-inverting input of amplifier 40 negative through resistor 44, however, diode 42 is a very much lower impedance path so the positive output drive from amplifier 39 prevails over the negative current through resistor 44. Thus, the output of amplifier 40 will go positive but a negative feedback path is established from the output of amplifier 40 through resistor 46 to the non-inverting input of amplifier 39. The optimum design calls for the resistors 41 and 46 to be equal, under which condition the closed loop gain of the active rectifier circuit will be unity and the output of amplifier 40 will follow the output of the amplifier 29 except that the polarity will be reversed. In summary, the output of amplifier 40 varies in magnitude in correspondence with the output of amplifier 29. However, when the output voltage of amplifier 29 is of positive polarity the output voltage of amplifier 40 will be positive and when the output voltage of the amplifier 29 is of negative polarity the output of the amplifier 40 will still be of positive polarity. The described active full wave rectifier circuit compensates for the rectifier diode threshhold, thereby resulting in a rectifier whose output is proportional to the input signal amplitude over a very wide dynamic range.

The output of the differencing amplifier 33 is applied to the active full wave rectifier circuit enclosed within the dotted lines identified by the numeral 47. These rectifier circuits are identical except for output polarity. At center frequency the outputs of both rectifier circuits are identical but of opposite polarity. The rectified signals from these rectifiers are summed in a combining amplifier 50 by the resistors 51 and 52. When the outputs of the rectifiers 38 and 47 are of opposite polarity, the amplifier 50 is a conventional summing amplifier. At center frequency these signals cancel out and, therefore, there is both no DC voltage and no carrier feedthrough ripple. As frequency deviates away from center, the output of one rectifier circuit increases and the other decreases in amplitude. A DC output voltage from amplifier 50 will be created proportional to the frequency deviation. Carrier feedthrough ripple will also appear and such ripple also will be proportional to deviation from center frequency. In order to remove such ripple the DC output voltage from the amplifier 50 is filtered by a 3-pole active low pass filter comprising an operational amplifier 55, resistors 56, 57 and 58, and the capacitors 59, 60 and 61. The FM demodulated output is taken from the line 62.

The input tone signal drives an active full wave rectifier 63 and the output of the quadrature network 11 drives a similar rectifier 64. These rectifiers are identical to the rectifier 47 and all three of these rectifiers have the same output polarity. The inputs to the rectifiers 63 and 64 are in quadrature and the rectified output signals are interlaced in time. The outputs of these two rectifiers are summed in an operational amplifier 66 by resistors 67 and 68, said amplifier producing a DC output voltage proportional to input signal level. As mentioned hereinabove, the carrier feedthrough ripple at the output of amplifier 66 is at four times signal frequency and the peak to peak amplitude of the ripple is considerably less than that from a single full wave rectifier. The output of amplifier 66 is processed through a 3-pole active low pass filter which filters out the remaining carrier feedthrough ripple. This filter is identical to the one connected between the amplifier 50 and the line 62 in the FM channel and comprises the amplifier 69 and associated resistors and capacitors. The AM demodulated output, free of ripple, is a DC voltage appearing on the line 70, the magnitude of such voltage being proportional to the amplitude of the tone input signal.

One application of the described circuitry is the simultaneously demodulation of FM and AM information coming in on a tone frequency carrier that has been quadrature modulated by two data signals or by data and a clock. Another application is in connection with an incoming tone signal which is only FM modulated by data and there is no AM modulation at the sending end. In this case, the FM demodulator extracts the data whereas the AM demodulator monitors the system for noise or interfering tones. Theoretically, received FM data signals have no AM component so if there is no noise and if there is no interference the output of the AM part of the demodulator is constant DC voltage. On the other hand, noise or an interfering tone riding in with the desired carrier will cause an instantaneous fluctuation in signal strength which will cause the output of the AM demodulator to fluctuate. Such voltage fluctuations can then be threshhold detected and the output of the threshhold detector can be used to squelch the FM demodulated data channel if signal impairment reaches a level which would cause excessive errors.

Various changes in the described circuitry can be made by those skilled in this art. It is apparent that the amplifier 50 produces an output that is proportional to the difference between the rectified magnitudes of the outputs of the amplifiers 29 and 33. In the case wherein the outputs of the rectifiers 38 and 47 are of opposite polarity the combining amplifier 50 is a summing amplifier. In the case wherein the outputs of these rectifiers are of the same polarity, the amplifier 50 is a differencing amplifier. Similarity, the AM channel rectifiers could be of opposite output polarities, in which case the combining amplifier 66 will be a differencing amplifier. It is also apparent that the rectifiers 38, 47, 63 and 64 need not be full wave rectifiers.

Having now described the invention what I desire to protect by letters patent is set forth in the following claims.

I claim:

1. A high speed FM demodulator for demodulating an incoming carrier frequency, which demodulator comprises,
   a. a quadrature all-pass network,
   b. a notch filter tuned to the carrier frequency,
   c. means applying the carrier signal to said network and said filter,
   d. a first summing amplifier,
   e. a first differencing amplifier,
   f. means applying the outputs of said network and the notch filter to both the said first summing and said first differencing amplifiers,
   g. first and second rectifiers,
   h. means applying the output of said first summing amplifier to one of the said rectifiers, i. means applying the output of said first differencing amplifier to the other of said rectifiers, and
j. a first combining amplifier to which the outputs of the said first and second rectifiers are applied.

2. The invention as recited in claim 1, including a low pass filter to which the output of said first combining amplifier is applied.

3. The invention as recited in claim 1, wherein the outputs of the said first and second rectifiers are of opposite polarity, and wherein said first combining amplifier is a summing amplifier.

4. The invention as recited in claim 1, wherein the outputs of the said first and second rectifiers are of the same polarity, and wherein said first combining amplifier is a differencing amplifier.

5. The invention as recited in claim 1, including a first full wave rectifier; a second full wave rectifier; means applying the carrier signal to one of the said full wave rectifiers; means applying the output of said quadrature network to the other of said full wave rectifiers; and a second combining amplifier to which the outputs of the said full wave rectifiers are applied.

6. The invention as recited in claim 5, including a low pass filter to which the output of said second combining amplifier is applied.

7. The invention as recited in claim 5, wherein the outputs of the said first and second full wave rectifiers are of the same polarity, and wherein said second combining amplifier is a summing amplifier.

8. The invention as recited in claim 5, wherein the outputs of the said first and second combining amplifiers are of opposite polarity, and wherein the said second combining amplifier is a differencing amplifier.

* * * * *